United States Patent
Tai et al.

(10) Patent No.: US 7,518,241 B2
(45) Date of Patent: Apr. 14, 2009

(54) WAFER STRUCTURE WITH A MULTI-LAYER BARRIER IN AN UBM LAYER NETWORK DEVICE WITH POWER SUPPLY

(75) Inventors: Li-Cheng Tai, Kaohsiung (TW); Jui-I Yu, Kaohsiung (TW); Jiunn Chen, Kaohsiung (TW); Chueh-An Hsieh, Kaohsiung (TW); Shyh-Ing Wu, Kaohsiung (TW); Shih-Kuang Chen, Kaohsiung (TW); Tsung-Chieh Ho, Kaohsiung (TW); Tsung-Hua Wu, Kaohsiung (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 238 days.

(21) Appl. No.: 11/513,142

(22) Filed: Aug. 31, 2006

(65) Prior Publication Data

US 2007/0045848 A1 Mar. 1, 2007

(30) Foreign Application Priority Data

Aug. 31, 2005 (TW) ............... 94129912 A

(51) Int. Cl.
*H01L 23/48* (2006.01)
(52) U.S. Cl. ............ 257/738; 257/773; 257/775; 257/780; 257/E23.021; 257/E23.069
(58) Field of Classification Search ............ None
See application file for complete search history.

(56) References Cited

U.S. PATENT DOCUMENTS

| 5,503,286 | A | * | 4/1996 | Nye et al. .................. 216/13 |
| 5,773,359 | A | * | 6/1998 | Mitchell et al. ............. 438/614 |
| 6,107,180 | A | * | 8/2000 | Munroe et al. ............. 438/613 |
| 6,486,053 | B2 | * | 11/2002 | Yi et al. .................. 438/613 |
| 6,930,389 | B2 | * | 8/2005 | Huang ..................... 257/737 |
| 7,253,519 | B2 | * | 8/2007 | Huang et al. ............... 257/738 |
| 7,261,828 | B2 | * | 8/2007 | Wu et al. .................. 216/13 |
| 2004/0238955 | A1 | * | 12/2004 | Homma et al. ............. 257/737 |

* cited by examiner

*Primary Examiner*—Alonzo Chambliss
(74) *Attorney, Agent, or Firm*—Rabin & Berdo, P.C.

(57) ABSTRACT

A wafer structure including a semiconductor substrate, a number of UBM layers and a number of bumps is provided. The semiconductor substrate has an active surface, a number of bonding pads and a passivation layer. The bonding pads are positioned on the active surface of the semiconductor substrate. The passivation layer covers the active surface of the semiconductor substrate and exposes the bonding pads. The UBM layers are respectively arranged on the bonding pads, and each UBM layer includes an adhesive layer, a super-lattice barrier layer and a wetting layer. The adhesion layer is disposed on bonding pads. The super-lattice barrier layer is disposed on the adhesion layer and includes a number of alternately stacked sub-barrier layers and sub-wetting layers. The wetting layer is disposed on the super-lattice barrier layer, and the bump is disposed on the wetting layer.

14 Claims, 2 Drawing Sheets

WAFER STRUCTURE WITH A MULTI-LAYER BARRIER IN AN UBM LAYER NETWORK DEVICE WITH POWER SUPPLY

This application claims the benefit of Taiwan application Serial No. 094129912, filed Aug. 31, 2005, the subject matter of which is incorporated herein by reference.

BACKGROUND OF THE INVENTION

1. Field of the Invention

The invention relates in general to a wafer structure, and more particularly to a wafer structure of enhancing the mechanical strength of the UBM layer.

2. Description of the Related Art

Along with the popularity of information technology, the application of multi-media product is gaining rapid growth. Meanwhile, the integrated circuit packaging technology has to take the current trends of digitalization, networkization, localization and personalization in electronic devices into consideration. In order to satisfy the above requirements, electronic elements must possess the features of high-speed processing, multi-functions, integration, miniaturization, light weight and low price. Therefore, the integrated circuit packaging technology is directed towards miniaturization and high density, and high density integrated circuit packaging technologies such as ball grid array (BGA), chip-scale package (CSP), flip chip (F/C), multi-chip module (MCM) are thus developed.

The integrated circuit packaging density refers to the number of pins per unit area. In terms of integrated circuit packaging, the length of wiring is shortened to improve the speed of signal transmission, and the application of bumps has become dominated high density packaging.

FIG. 1 is a cross-sectional view of a conventional flip-chip structure. In FIG. 1, the flip-chip package structure 100 includes a semiconductor substrate 110, a number of under bump metallurgy (UBM) layers 120, a number of bumps 130 and a chip 140. Only one of the UBM layers 120 and one of the bumps 130 are illustrated in FIG. 1. The semiconductor substrate 110 has an active surface 110a, a bonding pad 112 and a passivation layer 114. The bonding pad 112 is positioned on the active surface 110a of the semiconductor substrate 110. The passivation layer 114 covers the active surface 110a and exposes part of the bonding pad 112. The UBM layer 120 is disposed on bonding pads 112 and includes an adhesion layer 122, a barrier layer 124 and a wetting layer 126. The adhesion layer 122 is positioned on the bonding pad 112 of the semiconductor substrate 110. The barrier layer 124 is positioned on the adhesion layer 122. The wetting layer 126 is positioned on the barrier layer 124. The bump 130 is positioned on the wetting layer 126. The connecting pad 142 of chip 140 is electrically connected to the semiconductor substrate 110 via the bump 130.

It is noted that when the semiconductor substrate 110 and the chip 140 are heated, the coefficients of thermal expansion (CTE) of the two elements will dismatch, causing the bump 130 and the UBM layer 120 to receive horizontal shear force. The UBM layer 120 is very thin and has weak mechanical strength. Therefore, the UBM layer 120 will break when the shear force received by the UBM layer 120 is beyond the tolerable level, causing the electric connection between the semiconductor substrate 110 and the chip 140 to be disconnected, deteriorating the reliability of the flip-chip package structure 100.

SUMMARY OF THE INVENTION

It is therefore an object of the invention to provide a wafer structure whose UBM layer has an enhanced mechanical strength.

The invention achieves the above-identified object by providing a wafer structure. The wafer structure includes a semiconductor substrate, a number of UBM layers and a number of bumps. The semiconductor substrate has an active surface, a number of bonding pads and a passivation layer. The bonding pads are positioned on the active surface of the semiconductor substrate. The passivation layer covers the active surface of the semiconductor substrate and exposes the bonding pads. The UBM layers are respectively disposed on the bonding pads, and each UBM layer includes an adhesive layer, a super-lattice barrier layer and a wetting layer. The adhesion layer is disposed on bonding pads. The super-lattice barrier layer is disposed on the adhesion layer and includes a number of alternately stacked sub-barrier layers and sub-wetting layers. The wetting layer is disposed on the super-lattice barrier layer, and the bump is disposed on the wetting layer.

In a preferred embodiment of the invention, the thickness of the sub-wetting layers and the thickness of the wetting layer add up to X, the overall thickness of the sub-barrier layers adds up to Y, and the quotient of X/Y ranges between 3 and 4. Furthermore, the thickness of the wetting layer is Y1, the overall thickness of the sub-wetting layers add up to Y2, and the quotient of Y1/Y2 ranges between 1 and 2.

In a preferred embodiment of the invention, the sub-wetting layers have 10 to 25 layers, and the sub-barrier layers have 10 to 25 layers.

In a preferred embodiment of the invention, the thickness of a single sub-wetting layer ranges between 50 nm and 10 nm, and the thickness of a single sub-barrier layer ranges between 25 nm and 10 nm.

In a preferred embodiment of the invention, the material of the adhesion layer includes titanium, titanium tungsten alloy, chromium or aluminum.

In a preferred embodiment of the invention, the material of the sub-barrier layer includes nickel-vanadium alloy, chromium, nickel or chromium-copper alloy.

In a preferred embodiment of the invention, the material of the sub-wetting layer includes copper.

In a preferred embodiment of the invention, the material of the wetting layer includes copper.

To summarize, the super-lattice barrier layer of the wafer structure of the invention consists of a number of alternately stacked sub-barrier layers and sub-wetting layers. Each layer sub-barrier layer and each sub-wetting layer only has the thickness of a few tens of nm, so the stacked barrier layers have super-lattice structure, and the mechanical strength is enhanced. Therefore, when the wafer structure is heated, the UBM layer will not break due to the horizontal shear force or come off the bonding pads. Consequently, the reliability of the wafer structure is improved.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1:
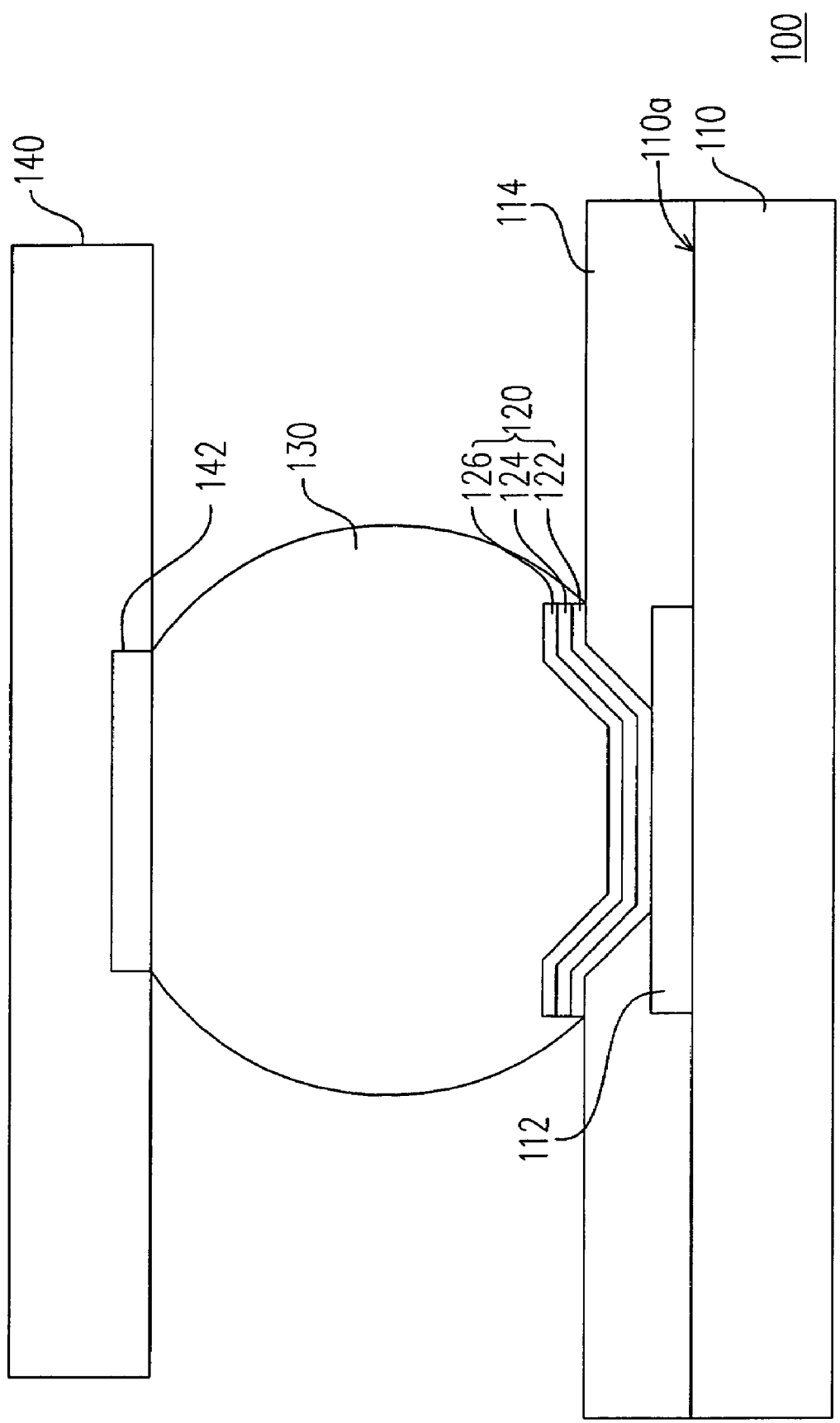
FIG. 1 (Prior Art) illustrates a cross-sectional view of a conventional flip-chip structure.
Figure 2:
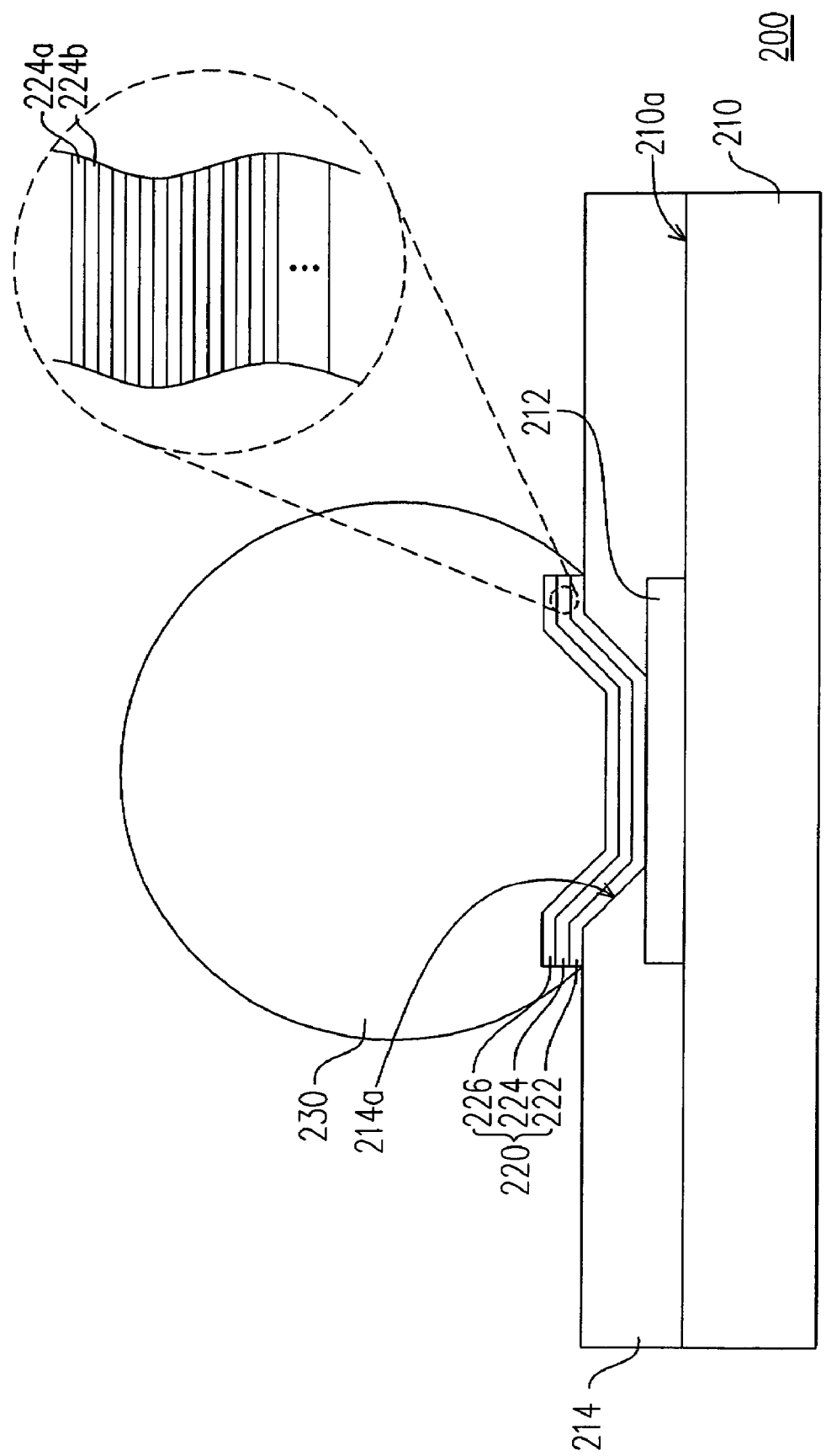
FIG. 2 illustrates a cross-sectional view of a wafer structure of the invention.

FIG. 2 illustrates a cross-sectional view of a wafer structure of the invention. The wafer structure 200 mainly includes a semiconductor substrate 210, a number of UBM layers 220 and a number of bumps 230. In FIG. 2, only one of the UBM layers 220 and one of the bumps 230 are illustrated.

The semiconductor substrate 210 has an active surface 210a, a number of bonding pads 212 and a passivation layer 214. In an embodiment of the invention, examples of the semiconductor substrate 210 include a silicon wafer whose active surface 210a has necessary elements and a bonding pad 212 formed thereon. The bonding pad 212 is used for electrically connecting the outside. The passivation layer 214 covers the active surface 210a disposed on the semiconductor substrate 210 and has an opening 214a for exposing the bonding pad 212. The material of the bonding pad 212 includes conductive materials such as copper and aluminum. The material of the passivation layer 214 includes inorganic compounds such as silicon oxide, silicon nitride or phosphosilicate glass (PSG), or organic compounds such as polyidmide.

The UBM layer 220 is disposed on the bonding pad 212 and includes an adhesion layer 222, a super-lattice barrier layer 224 and a wetting layer 226. The adhesion layer 222 is disposed on the bonding pad 212 to enhance the bonding strength between the bonding pad 212 and the super-lattice barrier layer 224. In an embodiment of the invention, the material of the adhesion layer 222 includes titanium, titanium tungsten alloy, chromium or aluminum. The super-lattice barrier layer 224 is disposed on the adhesion layer 222 to prevent the metal on the top and bottom of the super-lattice barrier layer 224 from diffusing. The invention has the following characteristics. The super-lattice barrier layer 224 includes a number of alternately stacked sub-barrier layers 224a and sub-wetting layers 224b. Each sub-barrier layer 224a and each sub-wetting layer 224b only have the thickness of a few tens of nm, so the stacked barrier layer has a super-lattice structure with enhanced mechanical strength. In an embodiment of the invention, the material of the sub-barrier layer 224a includes nickel vanadium alloy, chromium, nickel or chromium copper alloy, and the material of the sub-wetting layer 224b includes copper. Moreover, the sub-wetting layer 224b has 10 to 25 layers and so does the sub-barrier layer 224a. The thickness of single sub-wetting layer 224b ranges between 10 nm and 50 nm, and the thickness of a single sub-barrier layer 224a ranges between 10 nm and 25 nm. The user may adjust the material, the number of layers to be stacked, and the thickness of a single layer for the sub-barrier layer 224a and the sub-wetting layer 224b to fit actual needs, and are not limited to the exemplification of the invention. The wetting layer 226 is disposed on the super-lattice barrier layer 224 to enhance the adhesion between the UBM layer 220 and the bump 230. In an embodiment of the invention, the material of the wetting layer 226 includes copper.

The material of the bump 230 disposed on the wetting layer 226 includes tin-lead alloy, such as the tin-lead alloy bump whose tin-lead ratio is 63% to 37%, or the high-leaded alloy whose tin-lead ratio is 5% to 95%, or a composite bump structure of the two types of tin-lead alloy. Furthermore, the material of the bump 230 includes lead-free material such as tin, tin copper alloy, tin antimony alloy, tin bismuth alloy, tin indium alloy, tin zinc alloy, tin silver alloy, tin bismuth silver alloy, tin bismuth antimony alloy, tin bismuth zinc alloy, tin bismuth indium alloy or tin silver copper alloy.

If the overall thickness of the sub-wetting layers 224b and the thickness of the wetting layer 226 add up to X, and the overall thickness of the sub-barrier layer 224a add up to Y, then the quotient of X/Y preferably ranges between 3 and 4. For example, the overall thickness of the sub-wetting layers 224b is approximately 500 nm, the overall thickness of the wetting layer 226 is approximately 250 nm or 500 nm, and the overall thickness of the sub-barrier layer 224a is approximately 250 nm. Furthermore, if the thickness of the wetting layer 226 is Y1, and the overall thickness of the sub-wetting layers 224b is Y2, then the quotient of Y1/Y2 preferably ranges between 1 and 2. For example, the thickness of the wetting layer 226 is approximately 500 nm, and the overall thickness of the sub-wetting layer 224b is approximately 250 nm or 500 nm. The thickness of a layer and the ratio of the thickness between different layers are designed to enhance the mechanical strength of the UBM layer 220 and prevent the UBM layer 220 from coming off the bonding pad 212.

To summarize, the super-lattice barrier layer of the wafer structure of the invention consists of a number of alternately stacked sub-barrier layers and sub-wetting layers. Each layer sub-barrier layer and each sub-wetting layer only has the thickness of a few tens of nm, so the stacked barrier layers have super-lattice structure, and the mechanical strength is enhanced. Therefore, when the wafer structure is heated, the UBM layer will not break due to the horizontal shear force or come off the bonding pads. Consequently, the reliability of the wafer structure is improved.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A wafer structure, comprising:
   a semiconductor substrate having an active surface, wherein the semiconductor substrate has a plurality of bonding pads positioned on the active surface and a passivation layer, which covers the active surface exposes the bonding pads;
   a plurality of UBM layers disposed on the bonding pads, wherein each of the UBM layers comprises:
   an adhesive layer disposed on the bonding pads;
   a super-lattice barrier layer disposed on the adhesive layer, wherein the super-lattice barrier layer comprises a plurality of alternately stacked sub-barrier layers and sub-wetting layers;
   a welling layer disposed on the super-lattice barrier layer; and
   a plurality of bumps disposed on the wetting layer,
   wherein the thickness of the welling layer is Y1, the overall thickness of the sub-wetting layers adds up to Y2, and the quotient of Y1/Y2 ranges between 1 and 2.

2. The wafer structure according to claim 1, wherein the sub-wetting layers have 10 to 25 layers, and the sub-barrier layers have 10 to 25 layers.

3. The wafer structure according to claim 1, wherein the thickness of a single sub-welling layer ranges between 50 nm and 10 nm, and the thickness of single sub-barrier layer ranges between 25 nm and 10 nm.

4. The wafer structure according to claim 1, wherein the material of the adhesion layer includes titanium, titanium-tungsten alloy, chromium or aluminum.

5. The wafer structure according to claim 1, wherein the material of the sub-barrier layers includes nickel-vanadium alloy, chromium, nickel or chromium-copper alloy.

6. The wafer structure according to claim 1, wherein the material of the sub-welling layers includes copper.

7. The wafer structure according to claim 1, wherein the material of the welling layer includes copper.

8. A wafer structure, comprising:
   a semiconductor substrate having an active surface, wherein the semiconductor substrate has a plurality of bonding pads positioned on the active surface and a passivation layer, which covers the active surface exposes the bonding pads;
   a plurality of UBM layers disposed on the bonding pads, wherein each of the UBM layers comprises:
   an adhesive layer disposed on the bonding pads;
   a super-lattice barrier layer disposed on the adhesive layer, wherein the super-lattice barrier layer comprises a plurality of alternately stacked sub-barrier layers and sub-wetting layers;
   a wetting layer disposed on the super-lattice barrier layer; and
   a plurality of bumps disposed on the wetting layer,
   wherein the thickness of the sub-wetting layers and the thickness of the welling layer add up to X, and the overall thickness of the sub-barrier layers adds up to Y, and the quotient of X/Y ranges between 3 and 4.

9. The wafer structure according to claim 8, wherein the sub-wetting layers have 10 to 25 layers, and the sub-barrier layers have 10 to 25 layers.

10. The wafer structure according to claim 8, wherein the thickness of a single sub-wetting layer ranges between 50 nm and 10 nm, and the thickness of single sub-barrier layer ranges between 25 nm and 10 nm.

11. The wafer structure according to claim 8, wherein the material of the adhesion layer includes titanium, titanium-tungsten alloy, chromium or aluminum.

12. The wafer structure according to claim 8, wherein the material of the sub-barrier layers includes nickel-vanadium alloy, chromium, nickel or chromium-copper alloy.

13. The wafer structure according to claim 8, wherein the material of the sub-wetting layers includes copper.

14. The wafer structure according to claim 8, wherein the material of the wetting layer includes copper.

* * * * *